United States Patent
Lawrence et al.

(10) Patent No.: US 7,149,640 B2
(45) Date of Patent: Dec. 12, 2006

(54) METHOD AND SYSTEM FOR TEST DATA CAPTURE AND COMPRESSION FOR ELECTRONIC DEVICE ANALYSIS

(75) Inventors: Archer Lawrence, Austin, TX (US); Jack Little, Georgetown, TX (US); Brian Kleen, Pflugerville, TX (US); Robert Barr, Leander, TX (US)

(73) Assignee: King Tiger Technology, Inc., Austin, TX (US)

( * ) Notice: Subject to any disclaimer, the term of this patent is extended or adjusted under 35 U.S.C. 154(b) by 162 days.

(21) Appl. No.: 10/600,626

(22) Filed: Jun. 20, 2003

(65) Prior Publication Data

US 2005/0021275 A1    Jan. 27, 2005

Related U.S. Application Data

(60) Provisional application No. 60/390,584, filed on Jun. 21, 2002.

(51) Int. Cl.
*G01D 3/00* (2006.01)
(52) U.S. Cl. .................................................... 702/108
(58) Field of Classification Search ................ 702/108, 702/117, 118; 714/718, 735–738
See application file for complete search history.

(56) References Cited

U.S. PATENT DOCUMENTS

| | | | |
|---|---|---|---|
| 4,597,080 A * | 6/1986 | Thatte et al. ................ 714/726 |
| 5,321,701 A * | 6/1994 | Raymond et al. ........... 714/736 |
| 5,444,717 A * | 8/1995 | Rotker et al. ................ 714/744 |
| 5,617,531 A * | 4/1997 | Crouch et al. ................ 714/30 |
| 5,677,916 A * | 10/1997 | Nozuyama .................... 714/733 |
| 5,831,992 A * | 11/1998 | Wu ............................ 714/732 |
| 5,872,793 A * | 2/1999 | Attaway et al. ............. 714/726 |
| 5,899,961 A * | 5/1999 | Sundermann ................ 702/117 |
| 5,991,909 A * | 11/1999 | Rajski et al. ................ 714/729 |
| 6,105,154 A * | 8/2000 | Wang et al. ................. 714/732 |
| 6,380,730 B1 * | 4/2002 | Arkin et al. .............. 324/158.1 |
| 6,442,702 B1 * | 8/2002 | Ishikawa et al. ............ 713/340 |
| 6,694,466 B1 * | 2/2004 | Tsai et al. .................... 714/729 |
| 2003/0084387 A1 * | 5/2003 | Rooney et al. ............. 714/723 |
| 2003/0217345 A1 * | 11/2003 | Rajsuman et al. .............. 716/6 |

\* cited by examiner

*Primary Examiner*—Bryan Bui
*Assistant Examiner*—Demetrius Pretlow
(74) *Attorney, Agent, or Firm*—Hamilton & Terrile, LLP; Robert W. Holland (57) ABSTRACT

Electronic devices, such as memory devices are tested by applying test data, such as vectors of memory data having data field, control and address information, with a tester to detect error responses. Applied test data is captured, compressed and stored for subsequent analysis to isolate the test data associated with the error response. The saved compressed test data is de-compressed to replay the test data for a logic analyzer so that adequate history of the test data exists to determine the test cycles that included the stimulus associated with the error response. Identification of the test cycles that include the stimulus associated with the error response allows creation of test programs that run in reduced time by avoiding empty test cycles not associated with the error response.

12 Claims, 7 Drawing Sheets

METHOD AND SYSTEM FOR TEST DATA CAPTURE AND COMPRESSION FOR ELECTRONIC DEVICE ANALYSIS

RELATED APPLICATIONS

This application claims priority from U.S. Ser. No. 60/390,584, entitled "Behavioral Vector System" filed on Jun. 21, 2002 naming Archer Lawrence, Jack Little, and Brian Kleen as inventors, and is incorporated herein by reference in its entirety.

BACKGROUND OF THE INVENTION

1. Field of the Invention

The present invention relates in general to the field of electronic device testing, and more particularly to a method and system for capture and compression of test data applied to an electronic device for subsequent analysis.

2. Description of the Related Art

Advances in electronic device design and fabrication have resulted in a steady pace of improvements in the speed at which electronic devices process information and the quantity of information that electronic devices are able to process. For instance, processing devices, such as personal computer central processing units (CPUs), are fabricated with smaller and more densely placed transistors to allow a greater number of transistors in a smaller integrated circuit that operate at greater clock speeds. Similar fabrication techniques applied to storage devices, such as random access memory (RAM) and flash memory, provide increased storage in a given size of a memory integrated circuit and allow access to stored information at greater clock speeds. The improved operational speeds of electronic devices have led to the development of buses that transfer information between electronic devices at increased clock speeds to result in computer systems that have enhanced overall performance. For example, double data rate (DDR) RAM provides information reads and writes on both edges of a clock to allow more rapid accesses and storage by a CPU.

One difficulty with improved electronic device performance is that electronic device designs that provide improved performance generally do so with greater design complexity. The more complex an electronic device design becomes, the greater the likelihood that errors will occur in the development of the device, either in the design or the fabrication of the electronic device. Design and fabrication errors are typically identified and then corrected by applying test data to the electronic device and determining if application of the test data provides an expected output. When a response to a test stimulus varies from the expected response, test engineers attempt to isolate and debug the design or fabrication bug that produced the erroneous response. In order to thoroughly test an electronic device, test engineers generally attempt to pass large quantities of information through the electronic device. For instance, memory test systems generate vectors of test data that are written to a test memory integrated circuit or module and then read from the test memory to compare against the written test data. Vector generator test systems rapidly produce large quantities of test data to increase the probability of locating errors. Typically, a logic analyzer analyzes the test data to identify errors that occur so that test engineers may attempt to debug the errors.

Although rapid application of large quantities of test data by a vector generator test system improves the likelihood of generating errors compared with more directed test data generation involving smaller data quantities, the large quantities of data involved with vector generators often make isolation of the source of the error and debugging of the error a difficult task. For instance, generation of a particular error sometimes requires many iterations of data that have complex interactions on the electronic device, with erroneous data sometimes left unused within the electronic device for a number of cycles before its use results in an error response. Often such errors occur intermittently so that a certain percentage of electronic devices suffer from the error while other electronic devices operate normally. In such instances, if the electronic device is in or near production, manufacturers will sometimes continue with production while the error is debugged. Before electronic devices are shipped, the manufacturer sorts out devices with the known bug by running the test vectors on each produced electronic device that detect the bug and then discarding those electronic devices that manifest the error under test. However, the test vectors that generate errors are often long and complex, with a large quantity of test data passed across the electronic device to produce the error. The precise portion of the test vector that generated the bug is often difficult to identify since, over the course of its operation, a given test vector may intermittently effect data at a given location of the electronic device, making the identification of the specific portions of the test vector that generated the error the equivalent of finding a needle in a haystack. Further, since test vectors often involve large quantities of data, only recent history of the test vector and electronic device state are typically available for analysis. The generation of the test vectors and application of the test vector data to the electronic device to sort faulty devices during commercial production thus may consume a considerable amount of time resulting in substantially slower production of the electronic device.

SUMMARY OF THE INVENTION

Therefore a need has arisen for a method and system which aids in analysis of electronic device bugs detected through the application of test data to the electronic device.

A further need exists for a method and system which aids in the generation of test programs to identify known electronic device bugs in a reduced run time.

In accordance with the present invention, a method and system are provided which substantially reduce the disadvantages and problems associated with previous methods and systems for analysis of test data applied to an electronic device. Test data applied to an electronic device under test is captured, compressed and saved for subsequent de-compression and analysis to identify the data applied to the electronic device that manifests a bug. Identification of the data that manifests the bug supports creation of a test program having the relevant data and reducing empty cycles so that the test program rapidly detects the presence of the bug in an electronic device.

More specifically, a tester with a vector generator communicates test vectors of memory data for storage on a memory device and then reads the stored data to determine if an error exists in the memory device. A capture interface captures the test vectors communicated from the tester to the memory device and provides the captured test data to a compression engine. The compression engine compresses the test data by comparing captured vectors with previous vectors to identify data field, address or control information that matches the data field, address or control information of the previous vectors and by representing the matching information with opcodes to reduce the length of test vector words. In addition, the compression engine detects repeated test data and represents the repeated test data with the repeated value and a counter for the number of repeats. The compressed test vectors are reformatted as concatenated words of similar length suitable for storage in memory. If an error response is detected in the memory device under test, the stored compressed test vectors are retrieved, de-compressed and replayed for a logic analyzer to isolate the test vector cycles having the stimulus associated with the error response. A test program is created that generates the cycles of test vectors associated with the error response, reduces the test cycles not associated with error response, to allow more rapid testing of production memory devices for the identified error response.

The present invention provides a number of important technical advantages. One example of an important technical advantage is that analysis of de-compressed test data aids in the identification of electronic device bugs manifested through the application of test data to the electronic device. The capture of test data as it is applied to the electronic device allows direct analysis of actual test data, with the compression of the captured test data allowing storage of large quantities of historical test data for subsequent analysis. Thus, instead of simply identifying the manifestation of an electronic device bug with a logic analyzer over a short span of applied test data, the entire test vector or at least a substantial history of the test vector is available for analysis by de-compression of the captured test data.

Another example of an important technical advantage of the present invention is that analysis of de-compressed test data aids in the generation of test programs to identify known electronic device bugs in a reduced run time. Analysis of historical data of the test vector allows identification of the specific data values written to the electronic device that manifested the error. Identification of the specific stimulus associated with an error response allows generation of a test program to create the identified stimulus without intervening idle states or empty cycles. For instance, an error response generated at an electronic device node may result from a stimulus written at a substantially earlier cycle but not used until the error manifests. Analysis of de-compressed historical test data allows identification of the stimulus that eventually resulted in the error response and generation of a test program to re-create the stimulus without the intervening empty stimulus cycles. Thus, production testing for the error does not require a complete re-performance of the test vector and is accomplished in a more rapid manner.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Electronic device testing techniques that detect errors through the application of large quantities of test data to an electronic device are effective in that the application of large quantities of test data increases the likelihood of applying a stimulus that will manifest an error response from the electronic device. However, the application of large quantities of test data also increases the difficulty of isolating the source of an error to a particular stimulus or set of stimuli. The present invention aids in the analysis of an error response to locate the stimulus that generated the error response by capturing test data during test cycles, compressing the captured test data for storage, and then decompressing the captured test data for replay in a test environment. This permits at-speed testing of electronic devices across platforms and applications to find weaknesses or verify functionality. In the embodiment described herein in detail, memory cycles generated by a memory tester, specifically a vector generator, are captured and replayed in a memory test environment. In alternative embodiments, alternative electronic devices, such as processors, may have applied test data captured and compressed for subsequent analysis.

Figure 1:
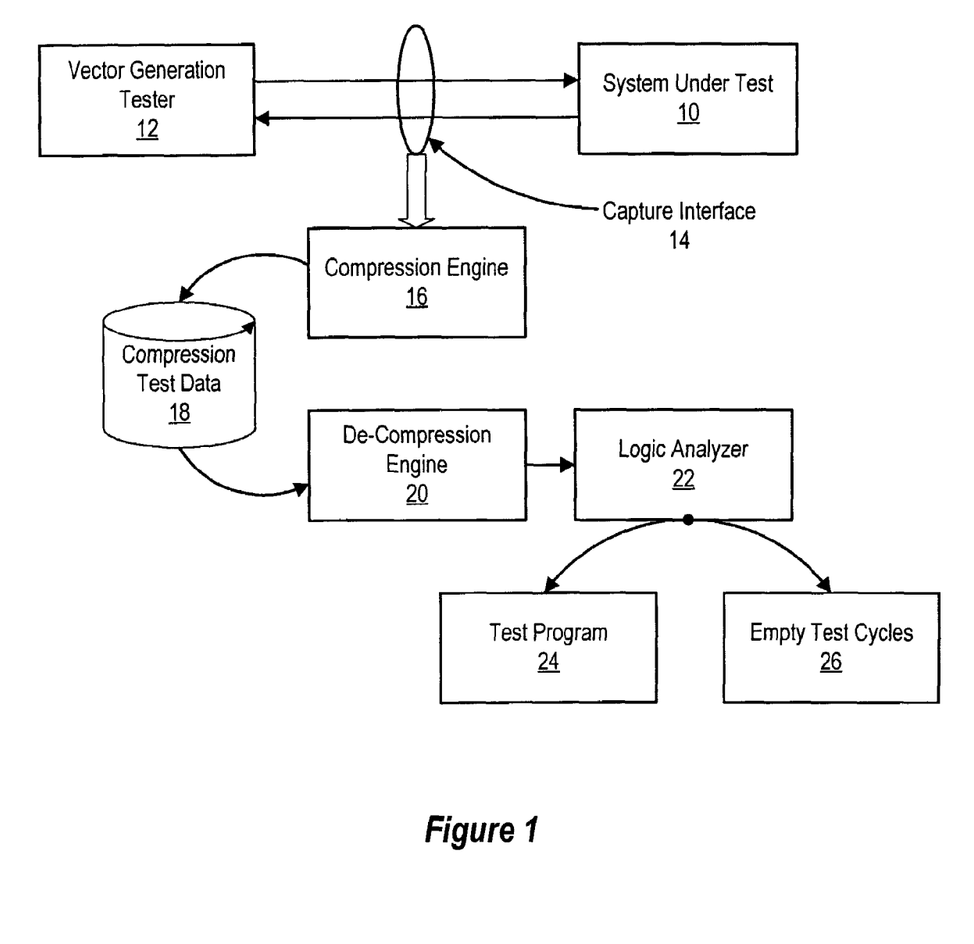
FIG. 1 depicts a functional block diagram of an electronic device testing system that compresses and saves test data for subsequent de-compression and analysis.

Referring now to FIG. 1, a functional block diagram depicts the operation of the present invention for testing a memory electronic device system under test 10. A vector generation tester 12 generates test data as vectors and applies the test data to system under test 10. A capture interface 14 disposed between system under test 10 and vector generation tester 12 captures test data and sends the test data to a compression engine 16. Compression engine 16 compresses the test data to reduce the space needed to save the test data in a compressed test data database 18. Compression engine 16 may compress and save an entire test run or save a predetermined history of test run by overwriting compressed test data in database 18 once a predetermined number of cycles have passed or a predetermined portion of memory is used to save the test data. If an error response is detected by tester 12, the test data is available for de-compression by de-compression engine 20 for analysis in a test environment. For instance, a logic analyzer 22 analyzes the test data to identify the stimulus that generated the error response by analyzing the test data history to separate stimuli applied to the defective portion of the system under test 10 from empty test cycles that did not apply stimulus. A test program 24 is generated to apply stimulus that will generate the identified error response while reducing or eliminating empty test cycles 26 that are not associated with the error response. With the de-compressed test data available to logic analyzer 22, the test data history allows analysis of the manner in which erroneous data was written even if the data persisted on system under test 10 for a number of test cycles before being applied to generate the detected error response.

Figure 2:
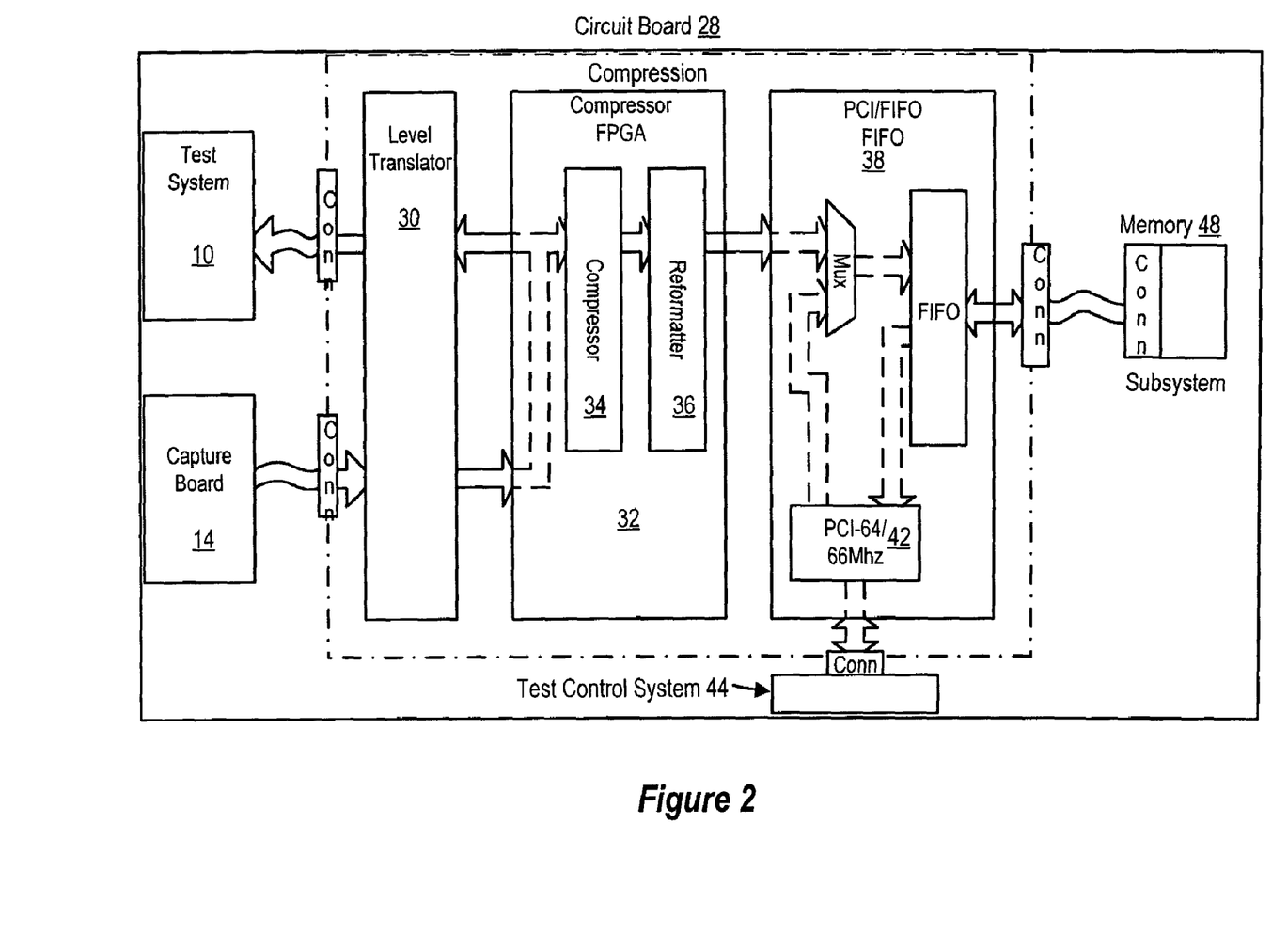
FIG. 2 depicts a system level block diagram of a compression circuit board.

Referring now to FIG. 2, a system level block diagram depicts a compression circuit board 28 for compressing test data provided from a vector generation tester to a memory system under test 10. A vector capture board 14 is inserted into a memory slot of a test application host system to capture the control, address and data signals sent to and from the memory module used by the host system. The captured signals are buffered and transmitted through a level translator 30 to a compressor FPGA 32 as differential signals having 8 address, 8 control and 16 data signals, each signal valid on rising and falling clock edges for a total of 16 address, 16 control and 32 data bits with each test vector. A compressor 34 on compressor FPGA 32 groups incoming 64 bit vectors into 4 compression fields, i.e., two data compression fields, an address compression field and a control compression field having the naming convention:

| Data Field 1 (16 bits) Group 3 | Data Field 0 (16 bits) Group 2 | Address Field (16 bits) Group 1 | Control Field (16 bits) Group 0 |
|---|---|---|---|
| 5A5A | 6161 | 1200 | 0505 |

Compressor 34 applies 16 compression commands so that all positional permutations of any 16-bit field may be replaced by a new field contained in a compressed vector:

| OP CODE | Data Field 1 | Data Field 0 | Address Field | Control Field | TYPE | Result size |
|---|---|---|---|---|---|---|
| 0000 | 5A5A | 6161 | 1200 | 0505 | New vector | 76 bits |
| 0001 | 5A5A | 6161 | 1200 | replace | Replace Group 0, 16 bits | 60 bits |
| 0010 | 5A5A | 6161 | replace | 0505 | Replace Group 1, 16 bits | 60 bits |
| 0100 | 5A5A | replace | 1200 | 0505 | Replace Group 2, 16 bit | 60 bits |
| 1000 | replace | 6161 | 1200 | 0505 | Replace Group 3, 16 bit | 60 bits |
| 0011 | 5A5A | 6161 | replace | replace | Replace Groups 0 & 1, 32 bit | 44 bits |
| 0110 | 5A5A | replace | replace | 0505 | Replace Groups 1 & 2, 32 bit | 44 bits |
| 1100 | replace | replace | 1200 | 0505 | Replace Groups 3 & 4, 32 bit | 44 bits |
| 0101 | 5A5A | replace | 1200 | replace | Replace Groups 0 & 2, 32 bit | 44 bits |
| 1010 | replace | 6161 | replace | 0505 | Replace Groups 1 & 3, 32 bit | 44 bits |
| 1001 | replace | 6161 | 1200 | replace | Replace Groups 0 & 3, 32 bit | 44 bits |
| 1110 | replace | replace | replace | 0505 | Replace Groups 1 & 2 & 3, 48 bit | 28 bits |
| 1101 | replace | replace | 1200 | replace | Replace Groups 0 & 2 & 3, 48 bit | 28 bits |
| 1011 | replace | 6161 | replace | replace | Replace Groups 0 & 1 & 3, 48 bit | 28 bits |
| 0111 | 5A5A | replace | replace | replace | Replace Groups 0 & 1 & 2, 48 bit | 28 bits |
| 1111 | replace | replace | replace | replace | Replace full Vector 64 bit | 12 bits |

The result of the compression look-up process is four result registers containing a 6-bit address value which may be equal to zero. If the input value is found in CAM, a "hit" has occurred and a corresponding hit signal for each field is used to generate an opcode according to the associated compression command listed in the above table. If a hit does not occur, then a "miss" is determined. One or more of four 16 bit fields associated with the miss(es) are assembled as right justified words of up to 76 bits in length. The smallest defined assembly unit is a 4 bit nibble with a given word having a maximum of 19 nibbles.

Compressor 34 passes the assembled right justified words with the miss fields, compressed address values and opcodes to a reformatter 36 to format the right justified words for storage in compressed test data database 18. The result of field replacements generates compressed vectors which are 12, 28, 44, 60 or 72 bits in length. For example, the following formats illustrate the output of compressor 34:

New vector

Input=5A5A61612000505

| 75 | 12 | 11 | 10 | 4 | 3 | 0 |
|---|---|---|---|---|---|---|
| 64 bit new vector | | | Vector addr | | OP | |
| 5A5A616112000505 | | 0 | Value 0 to 63 | | 0 | |

Single Field Replacement (C field)

Input=5A5AA6A61200FFFF, value FFFF found in CAM

| 75 | 12 | 11 | 10 | 4 | 3 | 0 |
|---|---|---|---|---|---|---|
| 48 bit new vector | | | Vector addr | | OP | |
| 5A5A61611200 | | 0 | Value 0 to 63 | | 1 | |

Double Field Replacement (C and A fields)

Input=5A5AA6A62222F5F5, value 2222F5F5 found in CAM

| 43 | 12 | 11 | 10 | 4 | 3 | 0 |
|---|---|---|---|---|---|---|
| 32 bit value | | | Vector addr | | OP | |
| 5A5AA6A6 | | 0 | Value 0 to 63 | | 3 | |

Triple Field Replacement (D0 and A and C fields)

Input=1111A6A62222F5F5, value A6A62222F5F5 found in CAM

| 27 | 12 | 11 | 10 | 4 | 3 | 0 |
|---|---|---|---|---|---|---|
| 16 bit value | | | Vector addr | | OP | |
| 1111 | | 0 | Value 0 to 63 | | 7 | |

Repeat Full Vector

Input=5A5A61612000505, full value found in CAM

| 11 | 10 | 4 | 3 | 0 |
|---|---|---|---|---|
| | Vector addr | | OP | |
| 0 | Value 0 to 63 | | F | |

Reformatter 36 realigns the compressed vectors into 64 bit words for storage in memory. However, a hazard present with the compressed vectors is that multiple field hits can be incurred with output addresses that are not equal. For instance, the sequential vectors:

4444333322221111
7777666611115555
AAAA111199998888
1111DDDDCCCCBBBB will result with the vectors being stored in sequential compressed addresses 0, 1, 2 and 3. If the next vector is:

1111000011111111 three hits will be generated by compressor 34, a control field hit with address value 0, an address field hit with address value 1, and a data 1 field hit with an address value 3. The opcode produced is 1011 or B, which indicates a 3 field replacement is to be performed, however there is no compressed address value location that contains the required replacement value. Thus, the address is ambiguous with three different and incorrect values. In order to resolve this hazard, a look-up table is used to identify and adjusts for the hazard.

Reformatter 36 then sequentially concatenates and parses the compressed vectors into 64 bit words for storage in external memory with a cross point switch that switches up to 76 bit words to a position within a 256 bit register. The reformatted compressed test data passes through a PCI/FIFO 38 into a MUX 40 that allows the test data to combine with data from a PCI bus 42 interfaced with an external test control system 44. The test data is then buffered through a FIFO 46 for transfer to memory subsystem 48.

Figure 3:
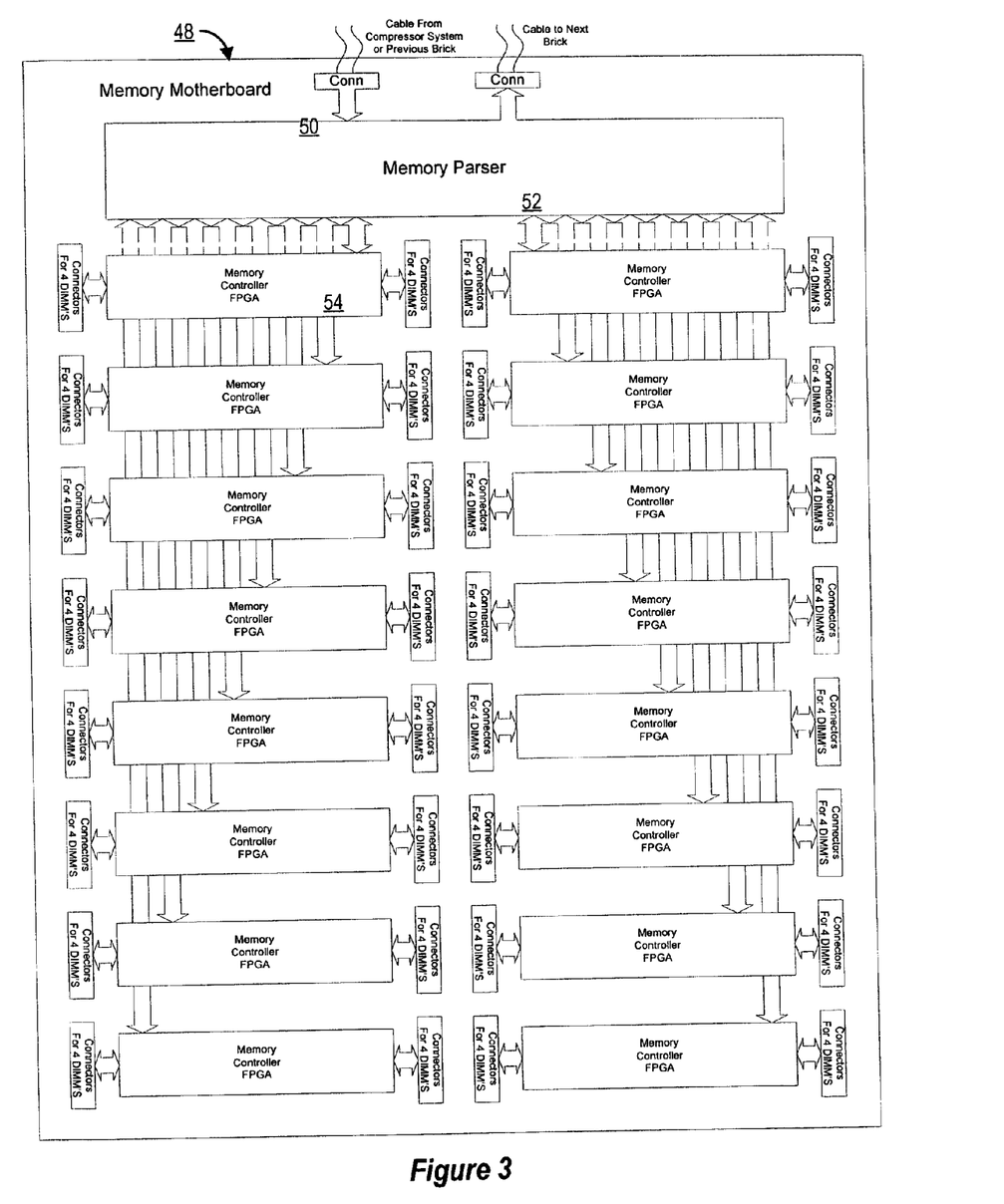
FIG. 3 depicts a functional block diagram of a memory motherboard adapted to store compressed test data.

Referring now to FIG. 3, a block diagram depicts memory subsystem 48 for storing compressed test data. A memory motherboard 50 supports plural memory controller FPGAs 54 and a memory parser 52. Each formatted 64 bit compressed vector has an 8 bit command code appended and then is stored in FIFO 46, a ×72 FIFO. When FIFO 46 is not empty and the contents of FIFO 46 are not part of a read operation, data is popped from it and pushed into memory controller FPGAs 54 by memory parser 52. Memory parser 52 splits the data out to the 16 memory controller FPGAs 54 for storage on memory daughtercards having standard memory modules, such as 8 168-pin Registered SDR DIMMs. Splitting test data out to the memory controllers 54 allows each memory bus to operate at lower frequency than that of the system capture operation. Test data is targeted at one of four memory controllers 54 at any given time. In one embodiment, two memory motherboards 50 are interfaced, each with its own memory parser 52 with a first memory motherboard 50 filled with test data before the second memory motherboard 50 is targeted. In alternative embodiments, additional memory motherboards 50 are added with each having a memory parser 52. PCI bus 42 controls selection to transfer compressed data or PCI bus data to FIFO 46 so that, during idle periods test control system 44 may send commands through PCI bus 42 to memory parsers 52 or memory controllers 54 to permit reads and writes to parser or controller registers and the memory arrays.

During capture writes, data in FIFO 46 is assumed to come only from compressor 34 so that the appended command field informs memory parser 52 to push compressed vectors from FIFO 46 to memory controllers 54 until FIFO 46 is empty, capture ends, the targeted motherboard is full or an error condition is detected. Popped compressed vectors are pushed into memory controllers 54 in a round-robin fashion with the data transferred to the memory array Hamming-coded by the memory controllers for single-bit error correction/double-bit error detection. When a memory motherboard is full, the memory parser 52 of the motherboard 50 asserts "DONE" to circuit board 28 for selection of another motherboard to accept test data. Reads of captured test data are performed by targeting test data from memory controllers 54 to FIFO 46 with parser 52 placing capture test data into FIFO 46 in the order the data was recorded based on data count, the starting memory controller and read capture commands provided from circuit board 28 to appropriate memory controllers 54. Parser 52 interprets commands from FIFO 46 to handle data flows between PCI bus 42 and memory controllers 54. Parser 52 pops elements from FIFO 46 each time FIFO 46 de-asserts an "EMPTY" flag, and data out of the array is checked and corrected for errors. Writes to memory motherboards 48 are pipelined in FIFO 46, but reads are done one at a time with parser 52 providing "DONE" flags to FIFO 46 when reads are completed.

Figure 4:
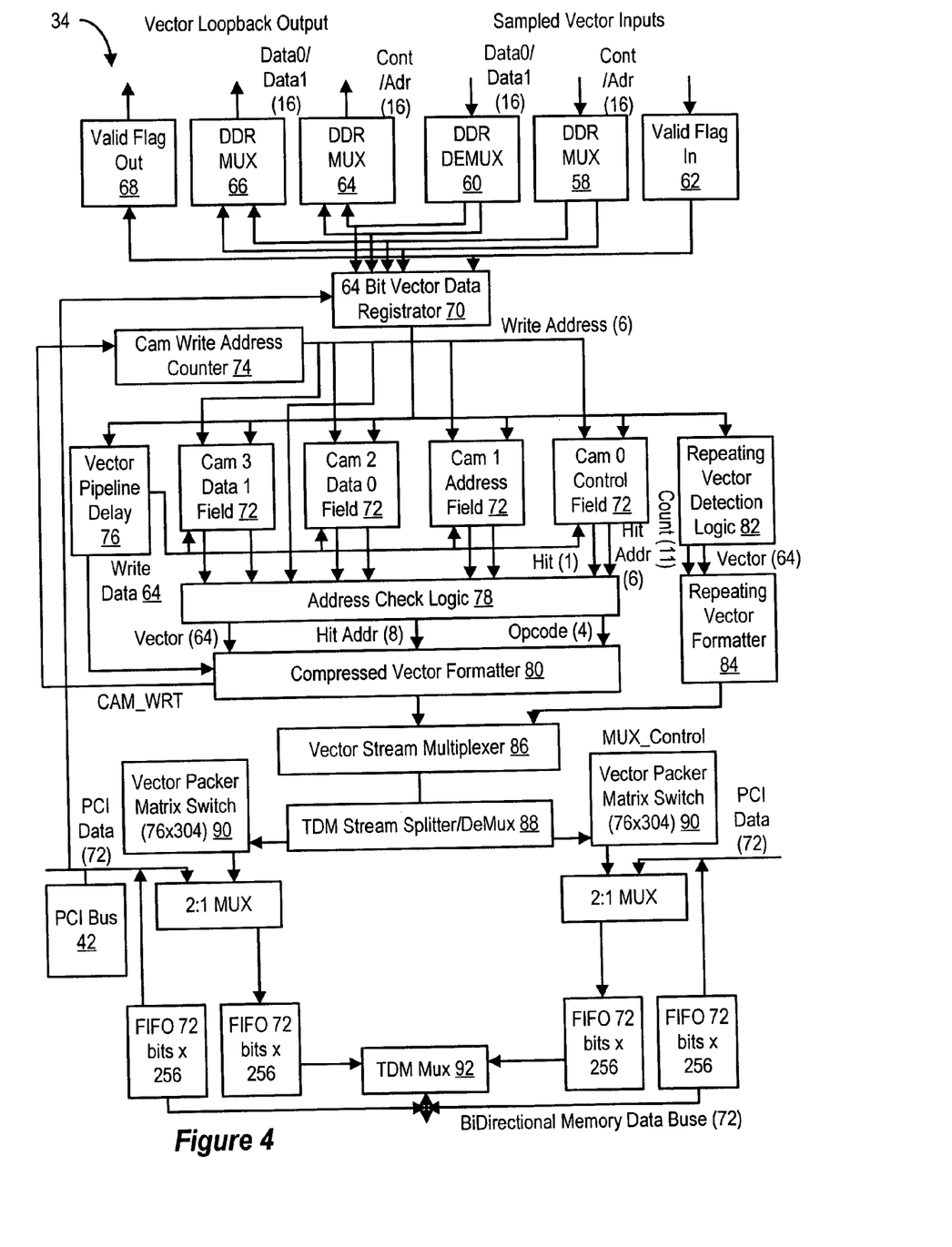
FIG. 4 depicts a circuit diagram of a compressor for compressing vector generated memory test data.

Referring now to FIG. 4, a circuit diagram depicts one embodiment of compressor 34 for processing captured test data. Captured control and address information is de-multiplexed by a control address demux 58 on rising and falling clock edges. Similarly, 32 bits of captured data are produced from a double data rate (DDR) input stream at data demux 60 so that a total of 64 bits of control, address and data information are collected in vector data register 70.

Test data in vector data register 70 is forwarded to four comparison modules 72, including a comparison module for control information, a comparison module for address information and two comparison modules for data information. Each comparison module is 16 bits wide and 64 locations deep. In each comparison module, the 16 bit input information is compared to all 64 locations and, if a match exists a 6 bit address is generated with a "HIT" output signal. If none of the four comparison modules 72 match, the input data is written into the next empty location as addressed by the CAM write address counter 74 and all four comparison modules write their input data. If any of the comparison modules 72 have a match, no write operation is performed and the input data is forwarded for compression processing. A vector pipeline delay 76 tracks data cycles through comparison modules 72 and an address check logic module 78 tracks HIT addresses for use by compressed vector formatter 80 to format compressed vectors.

In parallel with the comparison module operation, a repeating vector detection logic module 82 processes the input data to determine if two or more incoming vectors are the same. If repeating vectors are detected, a repeating compression output is formatted with repeating vector formatter 84. The repeating vector format includes the input data and a repeat count value, such as a number between 1 and 2047, that represents the number of times the input data is repeated. Compressed vector formatter 80 and repeating vector formatter 84 provide data to a vector stream multiplexer 86 which multiplexes the three types of output vectors produced by compressor 34: new vectors having 76 bit length with no compression, replacement vectors having 60, 44, 28 or 12 bits in length with compression, and repeating vectors having 76 bit length with compression of multiple 64 bit vectors. The output vectors are demultiplexed by a splitter 88 for parallel processing by vector packer matrix switches 90, and the parallel streams are then multiplexed for the compressor output by multiplexer 92.

Figure 5:
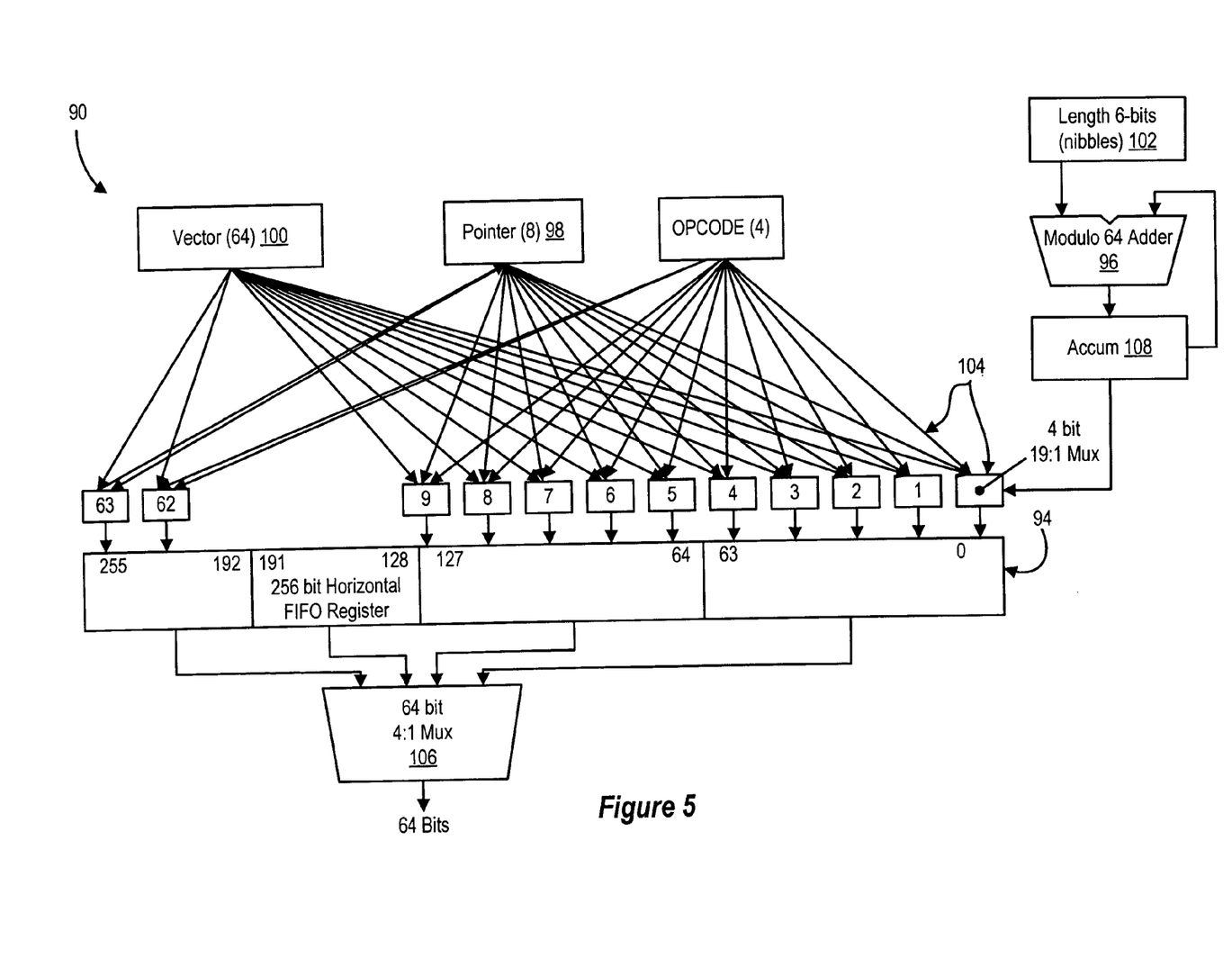
FIG. 5 depicts a circuit diagram of a vector formatter and packer for concatenating compressed test data vectors.

Vector packer matrix switches 90 reformats variable length compressed output vectors into 64 bit words suitable for storage in external memory. Referring now to FIG. 5, a circuit diagram depicts the vector packer matrix switch 90 having a horizontal FIFO register 94 that handles the variable length vectors that result from varying possible degrees of compression by compressor 34. A modulo 64 bit adder 96 maintains an index or pointer 98 to the current storage location within horizontal FIFO register 94. For each vector 100 to be packed, the vector length in nibbles 102 is added to the current count of modulo adder 96 to determine a new pointer for the first nibble of the next vector to be packed. Sixty-four 4 bit multiplexers 104 connect to each nibble of the input vector as determined by the pointer applied. For each new vector to be packed, a 256 bit accumulator in horizontal FIFO register 94 is clocked with the storage of vectors eventually wrapping around back to position zero. As 64 bits of vector are accumulated, the result is transferred out through multiplexer 106 and room is made for new vectors in an accumulator register 108 to track the transfer of the bits from register 94.

Figure 6:
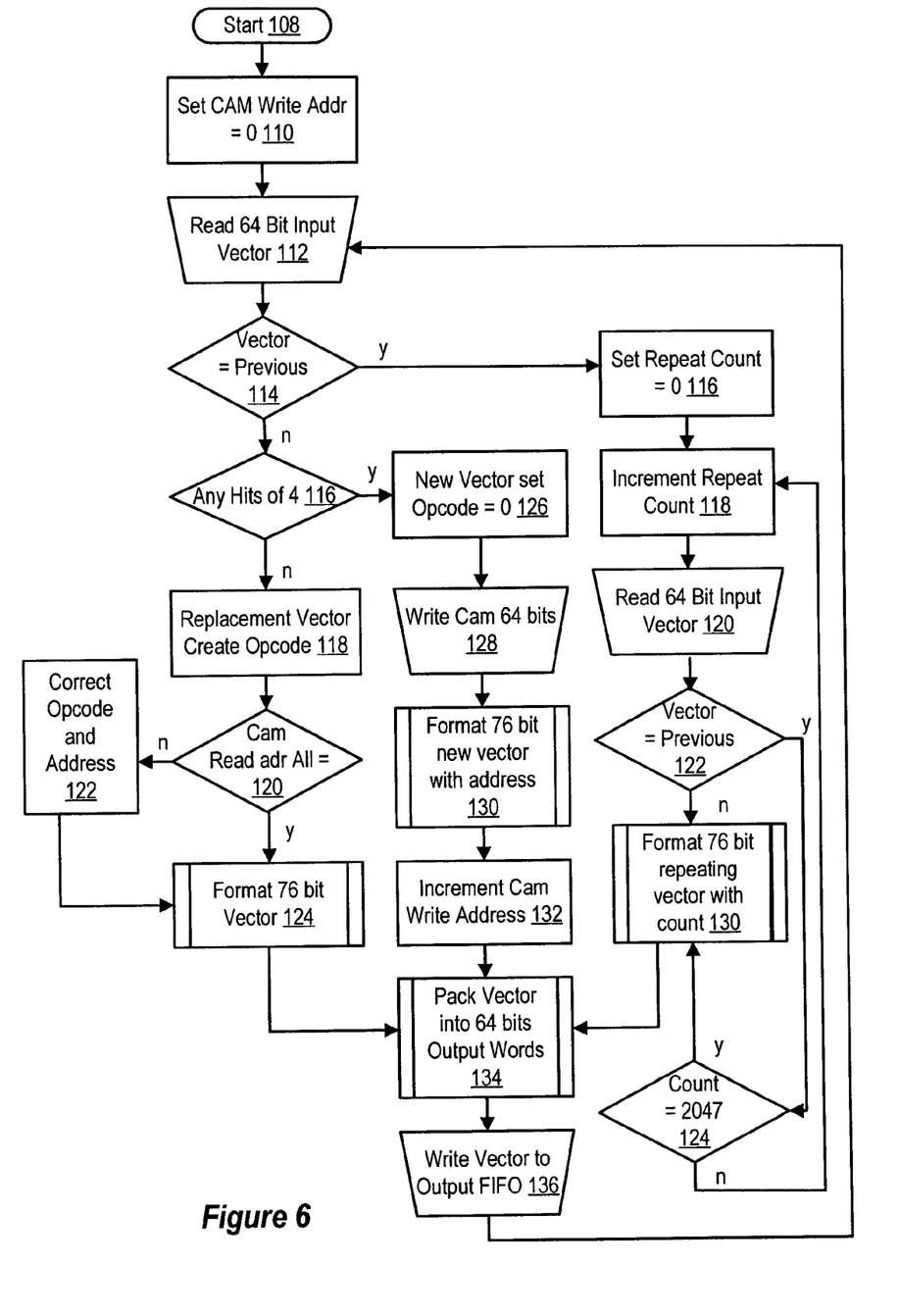
FIG. 6 depicts a flow diagram of a process for compressing test data.

Referring now to FIG. 6, a flow diagram depicts one embodiment of the process for compressing test data with compressor engine 16. The process starts at step 108 and at step 110 the CAM write address is initiated at a value of zero. At step 112, a 64 bit input vector is read from capture interface 14. At step 114 a determination is made of whether the input vector equals the previous input vector in order to select between comparison compression and repeat compression.

If the determination at step 114 is yes the vector equals the previous vector, the process continues to step 116 to initialize the repeat count at a value of zero. At step 118, the repeat count is incremented by one and at step 120 the input vector is read for comparison at step 122 with the repeat vector value. If the input vector matches the previous vector at step 122, the process continues to step 124 to determine if the repeat counter has exceeded the maximum value of 2047 and, if not, returns to step 118 to determine if the next input vector equals the repeat value. If the input vector does not match the previous vector at step 122 or the count reaches the maximum value of 124, the process continues to step 126 to format the repeat vectors with the repeat vector value and count.

If the determination at step 114 is no, the process continues to step 116 to determine if any HITS result from the comparison performed in the four CAM comparison modules. If a hit occurs, the process continues to step 116 to determine a replacement vector with an appropriate opcode at step 118. At step 120 a determination is made of whether the CAM read address falls within a hazard rule. If a hazard rule applies, the process continues to step 122 to correct the opcode and address. The process continues to step 124 to format the 76 bit vector from step 120 or corrected vector from step 122. If no HIT is found at step 116, the process continues to step 126 for a new vector determination with an opcode of 0. At step 128, the input vector is written to the CAM comparison modules and, at step 130 the new vector is formatted with an address. At step 132, the comparison module write address is incremented. At step 134, the repeat, compressed and new vector outputs are packed in 64 bit output words. At step 136, the output words are written to the output FIFO and the process returns to step 112 to read the next input vector.

Figure 7:
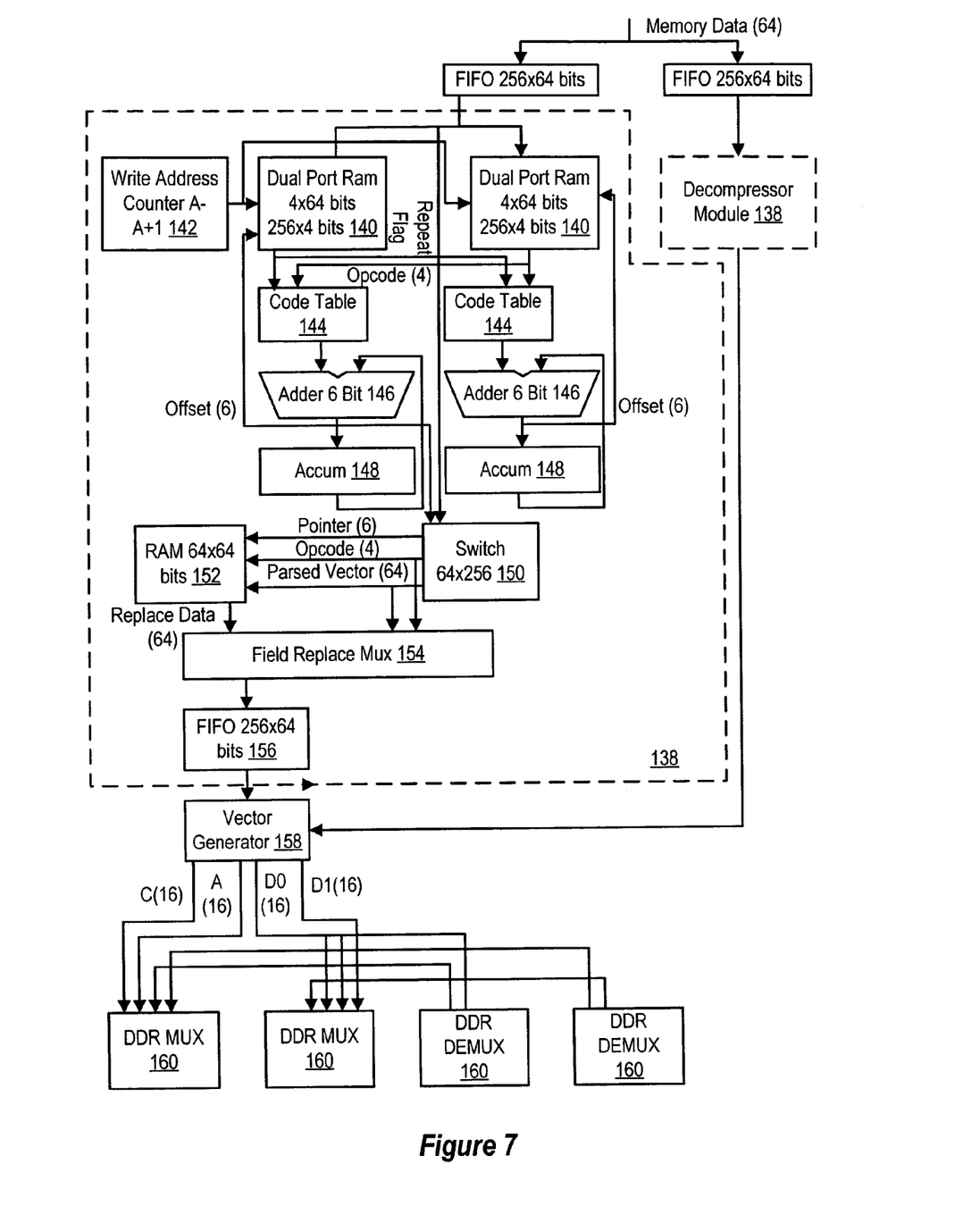
FIG. 7 depicts a circuit diagram of a de-compress engine for de-compressing compressed vector generated test data to recreate a vector generation test.

Referring now to FIG. 11, a circuit diagram depicts de-compression engine 20 for de-compressing saved test data to recreate and replay the vector test applied to an electronic device. For enhanced speed, compressed vector data is split and processed in parallel by de-compression modules 138 as parallel streams. The first vector to enter de-compression engine 20 has its opcode as the first nibble of 4 bits and is read into parallel dual-port RAM 140 with 64 bits in parallel into address 0. Each subsequent vector is stored in consecutive addresses, e.g., 1, 2, 3, and then the write address generator 142 rolls to zero on the next address so that the write port of the dual port RAM is organized as a 64 bit×4 word port. The read port of dual port RAM 140 is organized as a 4 bit×256 word port. The first read returns the 4 bit opcode of the first vector and is input to a code table 144 with the output of the code table representing the length in nibbles of the current vector:

| RFLAG | Opcode | Length (nibbles) |
|---|---|---|
| 0 | 0 | 19 |
| 0 | 1 | 7 |
| 0 | 2 | 7 |
| 0 | 3 | 11 |
| 0 | 4 | 7 |
| 0 | 5 | 11 |
| 0 | 6 | 11 |
| 0 | 7 | 15 |
| 0 | 8 | 7 |
| 0 | 9 | 11 |
| 0 | A | 15 |
| 0 | B | 15 |
| 0 | C | 11 |
| 0 | D | 15 |
| 0 | E | 15 |
| 0 | F | 3 |
| 1 | X | 19 |

If the input to code table 144 is the repeat flag RFLAG, the parallel dual port RAM 140 retrieves the value of the third nibble of the vector which contains the repeating vector flag bit. The length from the code table for both the non-repeat and repeat dual port RAMs is added with adder 146 to accumulator 148 to create a running offset address for each de-compressed vector with the offset address pointing to the opcode nibble of the next vector in RAM.

Compressed vectors of variable length concatenated into 64 bit words are separated into right justified form with cross point switch 150 in coordination with memory 152. Cross point switch 150 aligns compressed vector opcodes and pointer address fields for subsequent use and eventual discard with a 256 bit input and 76 bit output. Multiplexers in switch 150 use the vector offset address to shift any vector of any length in the input to a right justified position in the output to parse and normalize the vector. If the opcode is 0, the vector is a new vector that was not compressed which is stored in memory 152 at the address specified by the pointer address field and then the 64 bits of the new vector are switched to the output stream through field replace multiplexer 154. If the opcode is non-zero, then a portion of the vector is stored in memory 152 for recovery at the pointer address and merged into place of the compressed vector provided from switch 150. The decompressed vectors are thus returned to their original values at field replace multiplexor 154 and are then streamed through FIFO 156 to combine with parallel processed vectors from the other de-compress module 138 at vector generator 158. Vector generator 158 detects any repeating vectors present in the stream and regenerates the repeat vectors by their count fields. Vector generator 158 re-creates the DDR signal of the original vector generator through data, control and address multiplexers 160.

Although the present invention has been described in detail, it should be understood that various changes, substitutions and alterations can be made hereto without departing from the spirit and scope of the invention as defined by the appended claims.

What is claimed is:

1. An electronic device testing system comprising:
a tester operable to generate test data and apply the test data to the electronic device to determine the response of the electronic device, the test data including empty cycles not associated with an electronic device error response; a capture interface operable to capture the test data communicated to the electronic device by the tester;
a compression engine in communication with the capture interface and operable to compress the test data;
memory in communication with the compression engine and operable to save the compressed test data
a de-compression engine interfaced with the memory and operable to de-compress the test data; and
an analyzer interfaced with the de-compression engine and operable to analyze the decompressed test data to determine the test data source of an electronic device error response, the analyzer further operable to generate a test program that reduces the empty cycles of the test data.

2. The system of claim 1 wherein the tester is further operable to test production electronic devices to detect the error response.

3. The system of claim 1 wherein the tester comprises a vector generator operable to generate vector test data.

4. An electronic device testing system comprising:
a vector generator tester operable to generate vector test data and apply the test data to the electronic device to determine the response of the electronic device;
a capture interface operable to capture the test data communicated to the electronic device by the tester;
a compression engine in communication with the capture interface and operable to compress the test data, the compression engine comprising a compressor and a reformater, the compressor having plural comparison modules, each comparison module having a width adapted for comparing data field, address or control information and a depth for comparing predetermined cycles of test vectors, the comparison modules operable to represent test vectors having matching data field, address or control information with a representation having a reduced size to output compressed vectors having variable lengths, the reformater interfaced with the comparison modules and operable to reformat the compressed vectors of the comparison modules as concatenated words of similar length; and
memory in communication with the compression engine and operable to save the compressed test data;
wherein the electronic device comprises a memory device operable to store data fields according to address and control information and the vector generator generates memory vectors for storage on the memory device.

5. The system of claim 4 wherein the compressor further comprises repeating vector detection logic operable to detect repeating test data patterns and to represent the repeating test data patterns as a word having the repeating value and a counter for the number of times the value repeats.

6. An electronic device testing system comprising:
a tester operable to generate test data and apply the test data to the electronic device to determine the response of the electronic device;
a capture interface operable to capture the test data communicated to the electronic device by the tester;
a compression engine in communication with the capture interface and operable to compress the test data; and
memory in communication with the compression engine and operable to save the compressed test data;
wherein the memory further comprises:
plural memory motherboards;
a memory parser associated with each memory motherboard;
plural memory controllers associated with each memory parser; and
plural memory storage devices associated with each memory controller;
wherein the memory parser coordinates with its associated memory controllers to store test data on plural memory storage devices in sequence so that the memory storage devices operate on a lower clock speed than the test data generation clock speed.

7. A method for testing electronic devices, the method comprising:
generating test data for application to the electronic device;
communicating the test data to the electronic device through an interface;
capturing the test data communicated to the electronic device;
compressing the captured test data by comparing the data field, address and control information of a vector with the data field, address and control information of a predetermined number of previous vectors to identify matches in one or more of the data field, address and control information and by representing matches with defined opcodes that reduce the size of the vector;
storing the compressed test data;
detecting an error response by the electronic device to the test data; and
analyzing the compressed test data to identify the source of the error response;
wherein the electronic device comprises a memory device and generating test data further comprises generating vectors of memory test data for storage on the memory device, the memory test data having data field, address and control information.

8. The method of claim 7 wherein detecting an error further comprises:
reading test data stored on the memory device;
comparing the read test data with the test data written to the memory device; and
detecting an error if the read test data differs from the written test data.

9. The method of claim 7 wherein compressing the test data further comprises:
detecting repeat patterns; and
representing the repeat patterns with the repeated value and a count of the number of repeats of the repeat value.

10. A method for testing electronic devices, the method comprising:
generating test data for application to the electronic device;
communicating the test data to the electronic device through an interface;
capturing the test data communicated to the electronic device;
compressing the captured test data;
storing the compressed test data;
detecting an error response by the electronic device to the test data; and analyzing the compressed test data to identify the source of the error response;

wherein storing the compressed test data further comprises coordinating storage of the test data in plural storage devices so that the storage devices operate at a slower clock speed than the clock speed associated with the generation of the test data.

11. A method for testing electronic devices, the method comprising:

generating test data for application to the electronic device;

communicating the test data to the electronic device through an interface;

capturing the test data communicated to the electronic device;

compressing the captured test data;

storing the compressed test data;

detecting an error response by the electronic device to the test data;

de-compressing the compressed test data to replay the test data applied to the electronic device; and passing the replayed test data through a logic analyzer to determine the applied test data that generated an error response.

12. The method of claim 11 wherein analyzing the test data further comprises generating a test program to detect the error response by generating test data cycles associated with the error response and reducing test data cycles not associated with the error response.

* * * * *